US012683135B2

(12) United States Patent
Schlechte et al.

(10) Patent No.: US 12,683,135 B2
(45) Date of Patent: Jul. 14, 2026

(54) HIGH-PERFORMANCE ADAPTABLE SAMPLING SYSTEM

(71) Applicant: Tokyo Electron Limited, Tokyo (JP)

(72) Inventors: Charles Schlechte, Austin, TX (US);
Jianping Zhao, Austin, TX (US);
Michael Hummel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 46 days.

(21) Appl. No.: 18/621,594

(22) Filed: Mar. 29, 2024

(65) Prior Publication Data

US 2025/0308867 A1 Oct. 2, 2025

(51) Int. Cl.
*H01J 37/32* (2006.01)

(52) U.S. Cl.
CPC .. *H01J 37/32972* (2013.01); *H01J 37/32623* (2013.01); *H01J 37/32816* (2013.01); *H01J 37/32899* (2013.01); *H01J 37/32981* (2013.01); *H01J 2237/05* (2013.01); *H01J 2237/151* (2013.01); *H01J 2237/188* (2013.01); *H01J 2237/24592* (2013.01)

(58) Field of Classification Search
CPC .......... H01J 37/32899; H01J 37/32816; H01J 37/32623
See application file for complete search history.

(56) References Cited

U.S. PATENT DOCUMENTS

| | | | |
|---|---|---|---|
| 7,591,923 B2 | 9/2009 | Mitrovic et al. | |
| 11,232,939 B2 | 1/2022 | Arnold | |
| 11,430,643 B2 | 8/2022 | Zhao et al. | |
| 11,557,469 B2 | 1/2023 | Takahashi | |
| 2022/0102123 A1* | 3/2022 | Zhao ...................... | H01J 49/06 |
| 2024/0395514 A1* | 11/2024 | Agarwal ........... | H01J 37/32357 |

FOREIGN PATENT DOCUMENTS

| | | |
|---|---|---|
| JP | 2021504718 A | 2/2021 |
| KR | 20220070339 A | 5/2022 |
| WO | 2007106449 A2 | 9/2007 |
| WO | 2022083976 A1 | 4/2022 |
| WO | 2022140740 A1 | 6/2022 |

OTHER PUBLICATIONS

International Search Report and Written Opinion, PCT Application No. PCT/US2025/016159, mailed May 29, 2025, 10 pages.

* cited by examiner

*Primary Examiner* — Patrick C Chen
(74) *Attorney, Agent, or Firm* — Slater Matsil, LLP

(57) ABSTRACT

According to an embodiment, a plasma processing system is proposed. The plasma processing system includes a processing chamber for plasma; a two-chambered pumping block linked to the chamber through an orifice that creates a particle beam via a pressure difference, with the upper pressure regulated by a connected vacuum pump; a detector stage attached to the pumping block through another orifice and connectable to a vacuum pump to guide the beam through a third orifice; a mass spectrometer connected to the detector stage via the third orifice, featuring an ionizer that ionizes the beam's species by cycling through energy levels in multiple steps; and a shutter installed in the pumping block's path of the particle beam, designed to operate at each energy level step.

20 Claims, 7 Drawing Sheets

300

308

302                    306

304

308

300

304

302

600

604

604

602

604

600

604

604

604

602

HIGH-PERFORMANCE ADAPTABLE SAMPLING SYSTEM

TECHNICAL FIELD

The present disclosure generally relates to a processing system and, in particular, embodiments of a high-performance adaptable sampling system.

BACKGROUND

Diagnostic information plays a pivotal role in semiconductor processes, especially in plasma processes, where it underpins process optimization and equipment design improvements. Plasma processes, in particular, lead to the formation of various species (e.g., ions, neutral radicals, and metastable species) stemming from the gas-cracking patterns within the plasma chamber. Accurately measuring these species can assist in identifying the optimal processing parameters and designing better equipment.

However, challenges arise due to the difficulty of differentiating plasma species, which include charged particles like ions and electrons, and neutral background species. Background species may originate from, for example, residual gases or process byproducts, and their accurate identification can be crucial to controlling the process and understanding plasma chemistry. Direct sampling of plasma to discern ions and neutrals can be problematic, as it often disrupts the plasma and alters its characteristics. Moreover, due to recombination and neutralization events, sampling might not represent the plasma's true state.

A particular challenge lies in detecting trace species, which, despite their minimal presence, are vital for determining process quality. High-sensitivity detectors required for this task are typically costly, and the selection of the detectors necessitates a balance between precision and economic feasibility. Further complicating matters, Plasma-Enhanced Chemical Vapor Deposition (PECVD) systems can operate at higher pressures, which affects detector functions since many detectors, like mass spectrometers, perform best under lower pressures. At higher pressures, accuracy is compromised due to scattering and collisions, limiting the suitability of certain detectors in these environments.

SUMMARY

Technical advantages are generally achieved by embodiments of this disclosure, which describe a high-performance adaptable sampling system for a processing system.

A first aspect relates to a plasma processing system. The plasma processing system includes a processing chamber configured to contain a plasma; a pumping block fluidically coupled to the processing chamber via a first orifice, the pumping block having a first chamber and a second chamber vertically stacked, the first orifice configured to generate a particle beam from the plasma using a pressure differential between the first chamber and the processing chamber, a pressure of the first chamber controlled by a first vacuum pump coupled to the second chamber; a detector stage fluidically coupled to the pumping block via a second orifice, the detector stage couplable to a second vacuum pump configured to direct the particle beam to a third orifice; a mass spectrometer fluidically coupled to the detector stage via the third orifice, the mass spectrometer comprising an ionizer configured to ionize species of the particle beam by sweeping through a range of electron energies in a plurality of energy steps; and a shutter disposed in the pumping block between the first orifice and the mass spectrometer in a path of the particle beam, the shutter configured to open and close during each of the plurality of energy steps.

A second aspect relates to a sampling system for a plasma processing system. The sampling system includes a pumping block fluidically couplable to a processing chamber of the plasma processing system, the pumping block having a first chamber and a second chamber vertically stacked, the first chamber providing a path for a particle beam from a plasma within the processing chamber to in response to a pressure differential between the first chamber and the processing chamber, a pressure of the first chamber controlled by a first vacuum pump coupled to the second chamber; a shutter arranged in the pumping block in the path of the particle beam, the shutter configured to open and close during an energy sweep in a series of energy steps by an ionizer of a mass spectrometer, the ionizer configured to ionize species of the particle beam; and a detector stage fluidically coupled to the pumping block along the path of the particle beam, the detector stage couplable to a second vacuum pump configured to direct the particle beam to the mass spectrometer.

A third aspect relates to a method of measuring quantities of species in a processing chamber. The method includes closing a shutter positioned between the processing chamber and a mass spectrometer to block a particle beam originating from the processing chamber, the mass spectrometer comprising an ionizer, the shutter arranged in a first chamber of a pumping block, the pumping block having a second chamber coupled to a vacuum pump, the second chamber providing a pressure differential between the first chamber and the processing chamber to provide a path for the particle beam from the processing chamber to the first chamber; setting an electron energy of the ionizer to an initial energy value; sweeping the electron energy from the initial energy value to a final energy value by cyclically: collecting background quantification data while the shutter is closed, opening the shutter, collecting signal quantification data of species in the particle beam while the shutter is open, closing the shutter, and setting the electron energy to a next value; and after collecting signal quantification data with the electron energy set at the final energy value, determining quantities of species in the processing chamber using the signal quantification data and the background quantification data.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
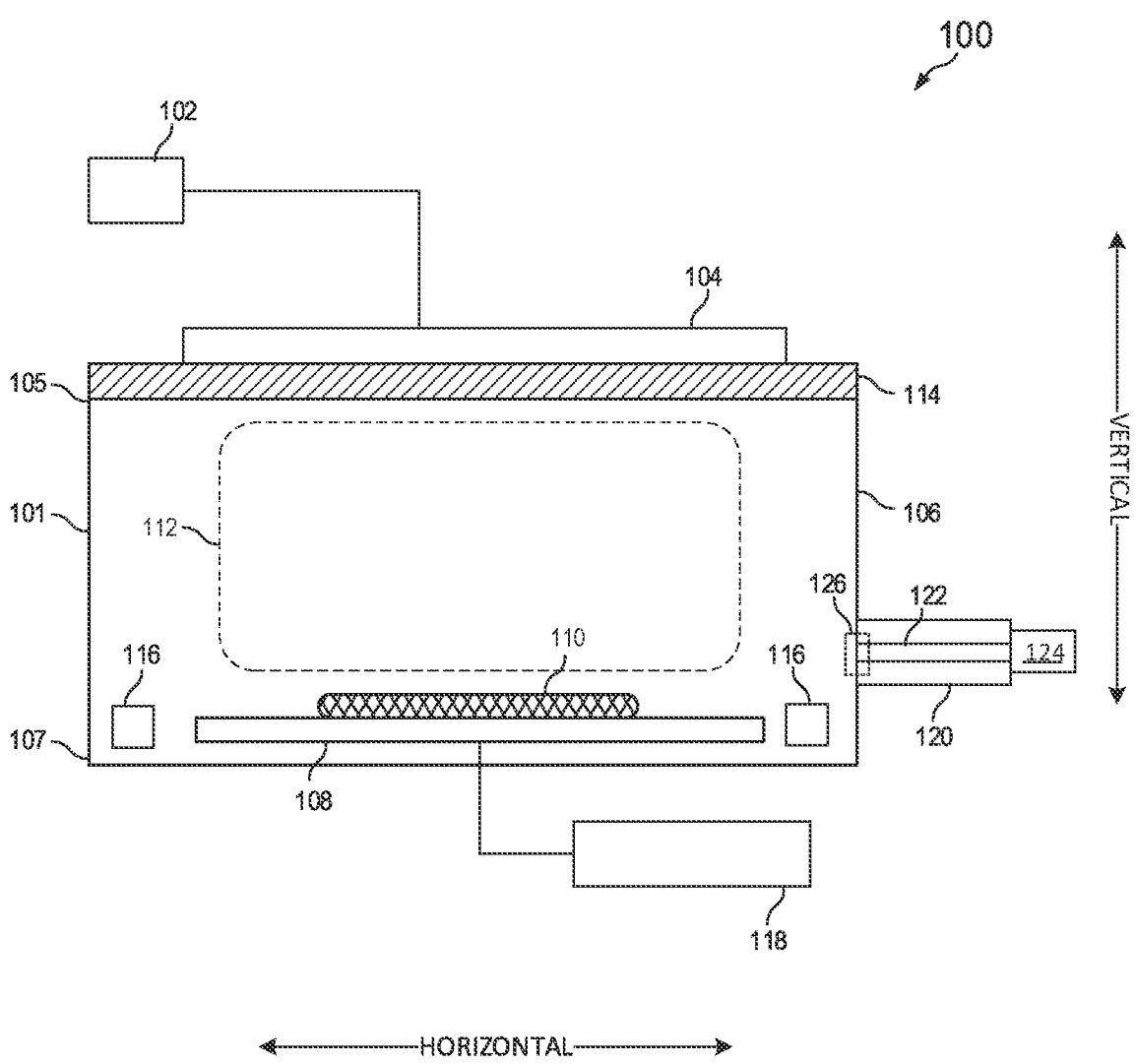
FIG. 1 is a diagram of an embodiment processing system.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of a plasma processing system using a mass spectrometer as a detector, it should also be appreciated that these inventive aspects may also apply to other analytical methods. In particular, aspects of this disclosure may similarly apply to optical spectrometry, serve as a system for endpoint detection during processing, or in Fourier-transform infrared spectroscopy (FTIR).

As discussed above, conventional sampling systems have many limitations and compromises. Traditional setups that link a detector to the plasma chamber can be expensive and bulky. Additionally, the sampling systems often have a limited measurement range. When trying to quantify and identify plasma species from background species, the sampling systems may fall short, potentially leading to misidentification or complete non-detection of certain elements.

In embodiments, a processing system is proposed to accommodate previously incompatible detectors, optimize signal quality, and deliver enhanced vacuum pump performance across various chamber pressures. It can differentiate between ionic and neutral species and effectively controls molecular flow in its structure, all while maintaining a compact design. Further, the proposed sampling system advantageously offers an understanding of the plasma conditions during its operation by capturing plasma dynamics in real time.

Aspects of this disclosure provide a sampling system with the capacity for trace species detection utilizing entry-level detectors, guaranteeing that users can monitor minor constituents within the plasma cost-effectively, balancing performance with practicality. The employment of these detectors can be crucial for extending process monitoring capabilities without imposing prohibitive cost increments on the operation.

The proposed sampling system ensures that extrinsic factors do not confound process parameters by identifying specific ions, radicals, and neutrals against potential contaminants or residual gases. These demarcations between plasma-active and background species-result in tighter process management, fostering better adherence to specifications.

In embodiments, a modular sampling system that improves the versatility of the processing system is proposed. The modular sampling system can function under a broad spectrum of chamber conditions, tolerating variations in pressure, temperature, and gas composition. The modular approach offers scalability and adaptability, enabling users to customize their detection suites by their process characteristics and ensuring that the system remains future-proof against evolving analytical demands. These and other details are further detailed below.

FIG. 1 illustrates a diagram of an embodiment processing system 100. Processing system 100 includes an RF source 102, a radiating antenna 104, a processing chamber 106, an optional dielectric plate 114, and a sampling system 120, which may (or may not) be arranged as shown in FIG. 1. Further, processing system 100 may include additional components not depicted in FIG. 1, such as a matching network between the RF source 102 and the radiating antenna 104. The processing system 100, in embodiments, may be housed within an enclosure, which may be a Faraday cage or solid.

RF source 102 provides forward RF waves to the radiating antenna 104. The forward RF waves travel through the radiating antenna 104 and are transmitted (i.e., radiated) towards processing chamber 106.

Processing chamber 106 may be any suitable processing chamber. In embodiments, the processing chamber 106 is a semiconductor processing chamber. In an embodiment, the processing chamber 106 is a plasma chamber in a plasma etching chamber or a plasma deposition chamber. In embodiments, the processing chamber 106 is a thermal processing chamber. In an embodiment, the processing system 100 is a plasma-enhanced atomic layer deposition (PE-ALD) system. In embodiments, the processing system 100 is a thermal processing system. In one or more embodiments, the processing system 100 is a multi-purpose processing system capable of executing various processes.

Generally, it is desirable to monitor chemical species within the processing chamber 106. Accordingly, the processing system 100 may include, in addition to or instead of the specific examples mentioned above, lithography bake modules, gas etch/cleaning/stripping modules, and others. In some applications, the processing chamber 106 may be generalized to be other parts of a processing system, such as a gas supply line, vacuum line (e.g. chemical analysis in downstream vacuum lines to glean information about upstream processes), exhaust line, as well as other locations where quantifying the chemistry of a gas phase to characterize a process may be desirable.

The processing chamber 106 may include sidewalls 101, a base 107, and a top cover 105, which may be made of a conductive material, for example, stainless steel or aluminum coated with a film, such as yttria (e.g., YxOy or YxOyFz, etc.), or a film consistent with the process (e.g., carbon, silicon, etc.), or as known to a person of ordinary skill in the art. In embodiments, the processing chamber 106 is cylindrical with a base 107 and a top cover 105 that are circular.

The processing chamber 106 includes a substrate holder 108 (i.e., chuck). As shown, substrate 110 is placed on substrate holder 108, positioned at the base 107 of the processing chamber 106, to be processed. The substrate holder 108 securely holds and electrostatically clamps the substrate 110 during processing.

Optionally, the processing chamber 106 may include a bias power supply 118 coupled to the substrate holder 108. The bias power supply 118 can improve the uniformity of the plasma 112 in the processing chamber 106.

Optionally, processing chamber 106 may include one or more pump outlets 116 to remove by-products from processing chamber 106 through selective control of gas flow rates. In embodiments, pump outlets 116 are placed near (e.g., below/around the perimeter of) substrate holder 108 and substrate 110. In embodiments, the processing chamber 106 may include additional substrate holders (not shown). In embodiments, the placement of the substrate holder 108 may differ from that shown in FIG. 1. Thus, the quantity and position of the substrate holder 108 are non-limiting.

In embodiments, radiating antenna 104 is separated from the top cover 105 of the processing chamber 106 by the dielectric plate 114 (i.e., a dielectric window), typically made of a dielectric material such as quartz. Dielectric plate 114 separates the low-pressure environment within processing chamber 106 from the external atmosphere. It should be appreciated that radiating antenna 104 can be placed directly adjacent to the top cover 105 of the processing chamber 106, or radiating antenna 104 can be separated from processing chamber 106 by air. In embodiments, the dielectric plate 114 is selected to minimize reflections of the RF wave from the processing chamber 106. In other embodiments, the radiating antenna 104 is embedded within the dielectric plate 114.

In an embodiment, the radiating antenna 104 couples RF power from RF source 102 to the processing chamber 106 to treat substrate 110. In particular, radiating antenna 104 radiates an electromagnetic wave in response to being fed the forward RF waves from the RF source 102. The radiated electromagnetic wave penetrates from the atmospheric side (i.e., side at radiating antenna 104) of the dielectric plate 114 into the processing chamber 106. The radiated electromagnetic wave generates an electromagnetic field within the processing chamber 106. The generated electromagnetic field ignites and sustains plasma 112 by transferring energy to free electrons within the processing chamber 106. The plasma 112 can be used to, for example, selectively etch or deposit material on substrate 110.

Sampling system 120 determines the species density, identification, and quantification in processing chamber 106. Detecting trace species can be pivotal in refining process quality, particularly in applications demanding stringent purity and composition standards. The capacity to segregate ionic species can be beneficial in processes where the ionic composition directly correlates with the properties of the treated substrate, such as in ion implantation or etching applications.

The improved understanding of the plasma using the sampling system 120 allows for improved process outcomes, contributing to enhanced uniformity, precision, and consistency in the treated materials. Further, the ability to extrapolate process variables from observed plasma behavior leads to more predictive control strategies, enabling users to adjust parameters to achieve desired results repeatedly.

In embodiments, the sampling system 120 is coupled to a detector 124. Detector 124 is fluidically coupled to a sampling orifice 126 of processing chamber 106 via sampling chamber 122. The sampling orifice 126 incorporates a small opening on, for example, the sidewalls 101 of the processing chamber 106 that allows for the transport of plasma constituents from the high-pressure environment of the processing chamber 106 to the low-pressure environment suitable for the detector 124 through the sampling chamber 122. Given the pressure disparity, differential pumping stages (not shown) are often used to maintain the pressure gradient and preserve the sample's integrity during transit.

In embodiments, sampling chamber 122 incorporates a shutter mechanism that, when open, shapes a beam of particles toward detector 124. In embodiments, sampling chamber 122 fluidically couples the processing chamber 106 through the sampling orifice 126 to create the beam of particles originating from the processing chamber 106 by exploiting the pressure difference between sampling chamber 122 and processing chamber 106.

Various species may be detected by detector 124. In various embodiments, neutral species originating from processing chamber 106 are detected by detector 124; however, ions may also be detected. Detector 124 can be a mass spectrometer equipped with an ionizer (e.g., a filament) capable of ionizing the species present in the particle beam by cycling through various electron energy levels in a series of incremental energy steps. The ionizer may be included in a chamber fluidically coupled to the mass spectrometer along the path of the particle beam. Alternatively, the ionizer may be contained within the mass spectrometer.

In an embodiment, detector 124 functions as a Residual Gas Analyzer (RGA). The RGA mass spectrometer may include a mass filter (e.g. an electromagnetic filter such as a quadrupole filter) that only allows a narrow range of masses to pass through at a given time. Since the operational mechanism of the mass filter may be electromagnetic, the ability of particles to pass through the mass filter may also depend on charge. For example, the mass filter of detector 124 may only allow particles with a similar mass/charge ratio (m/z) to pass through and reach the detector.

Detector 124 may require a sufficiently low pressure to operate. For example, the pressure in the detector 124 may be less than about $6 \times 10^{-6}$ Torr. Sampling chamber 122 may facilitate an appropriate pressure differential between processing chamber 106 and detector 124 to allow detector 124 to operate and form the particle beam.

While FIG. 1 illustrates a singular sampling chamber 122 coupled to a singular detector 124, it should be understood that sampling system 120 may include multiple sampling chambers and detectors. These additional sampling chambers can be arranged in a cascaded fashion where each sampling chamber is fluidically intercoupled to its respective vacuum pump. Further, the sampling chambers within sampling system 120 may be strategically located upstream or downstream relative to a shutter chamber and positioned between processing chamber 106 and detector 124 to suit specific processing requirements.

Figure 2:
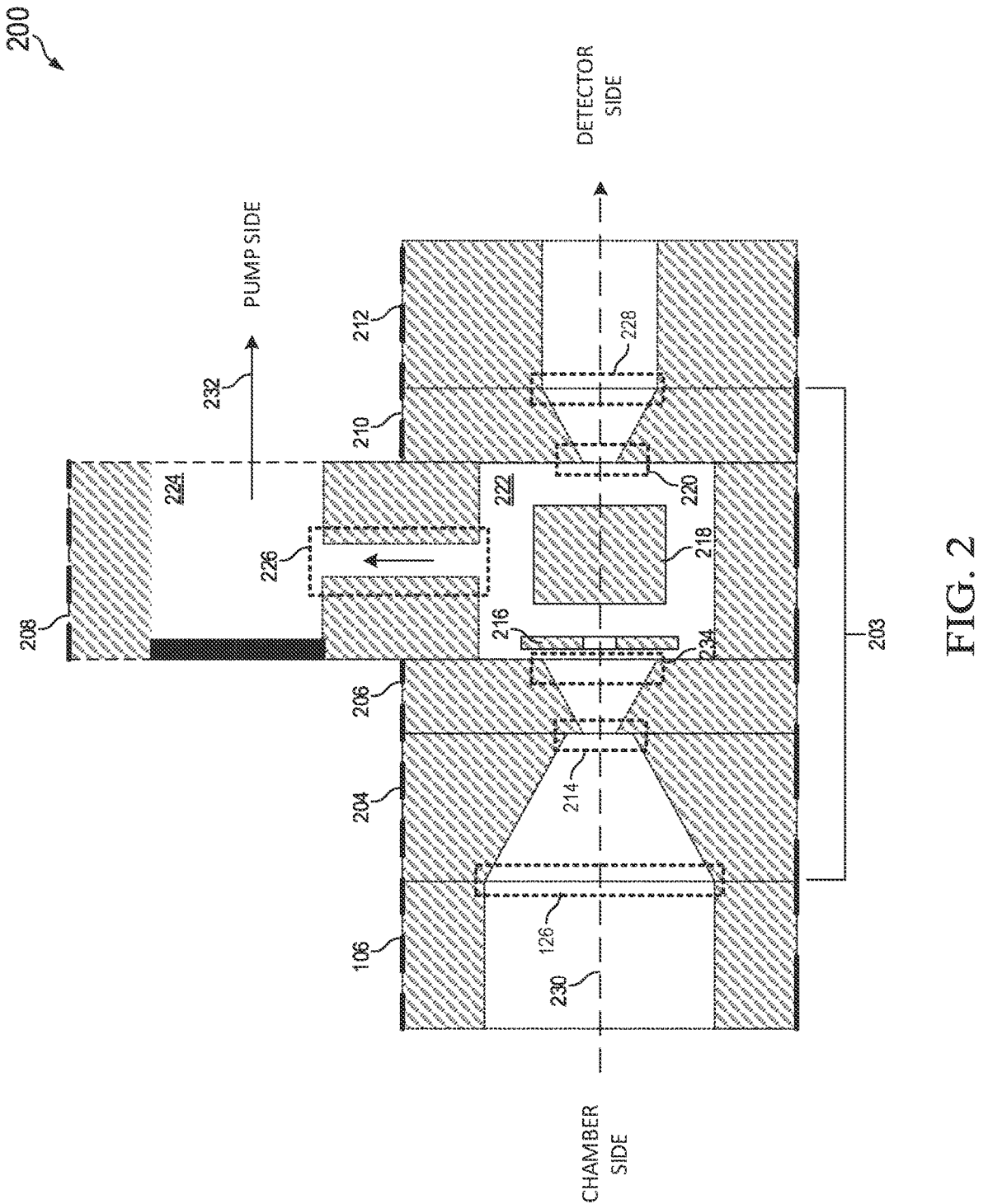
FIG. 2 is a schematic cross-sectional view of an embodiment sampling system.

FIG. 2 illustrates a schematic cross-sectional view of an embodiment sampling system 200, which may be implemented in the processing system 100 as the sampling system 120. As shown, sampling orifice 126 allows the transporting of plasma constituents from processing chamber 106 to detector 124 through sampling chamber 203. Sampling chamber 203 may be implemented in the sampling system 120 as the sampling chamber 122.

Sampling chamber 203 includes a focusing chamber 204, a first aperture 206, a pumping block 208, a second aperture 210, and a detector stage 212, which may (or may not) be arranged as shown. Sampling chamber 203 may include additional components that are not shown.

The focusing chamber 204, the first aperture 206, the second aperture 210, and detector stage 212 act as a series of skimmers and collimation mechanisms that direct the supersonic beam of particles along the molecular beam path 230 from the processing chamber 106 to detector 124. Collectively, these components reduce the speed and temperature of the sampled species and enable the analysis of neutrals and radicals in addition to ions.

Focusing chamber 204 serves as an intermediary component between processing chamber 106, where ions or neutral species are generated, and detector 124, which analyzes these species. Focusing chamber 204 includes a cone-shaped internal structure with two different openings. A larger opening of the focusing chamber 204 faces the sampling orifice 126, and a smaller orifice 214 is oriented toward the detector 124. The larger opening (at the sampling orifice 126) is designed to capture a broad sample of the ions or neutrals emerging from the processing chamber 106. This design ensures that a representative sample of the plasma 112 is available for analysis and reduces the loss of species that might occur if the opening were too small.

Once inside the focusing chamber 204, the plasma constituents are guided and focused toward the smaller orifice 214, leading to the first aperture 206 and pumping block 208. The smaller orifice 214 ensures that a directed and concentrated sample of species arrives at the pumping block 208. By reducing the opening size, the focusing chamber 204 focuses the particles towards the opening in the ion repeller 216 of the pumping block 208.

In embodiments, the diameter of the sampling orifice 126 is between 16.875 and 17.125 millimeters (mm); and in an embodiment, the diameter of the sampling orifice 126 is 17 mm. In embodiments, the diameter of the smaller orifice 214 is between 3.375 and 3.625 mm; and in an embodiment, the diameter of the smaller orifice 214 is 3.5 mm. In embodiments, the length of the focusing chamber 204 (along the outward particle flow 232) is between 67 and 77 mm; and in an embodiment, the length of the focusing chamber 204 is 72 mm.

The first aperture 206 and the second aperture 210 serve as a series of skimmer mechanisms along the molecular beam path 230. Skimmers are employed to narrow down the beam, which enhances the signal strength while minimizing the interference from background gases. The skimmer functionality of the first aperture 206 and the second aperture 210, using cone-shaped mechanical structures, reduces the speed and temperature of the sampled species and enables the analysis of neutrals and radicals in addition to ions.

In embodiments, the diameter of the smaller orifice 214 of the cone-shaped first aperture plate 206 is between 0.05 and 0.5 mm; and in an embodiment, the diameter is 0.125 mm. In embodiments, the diameter of the larger opening 234 of the cone-shaped first aperture plate 206 is between 19 and 21 mm; and in an embodiment, the diameter is 20 mm. In embodiments, the length of the first aperture 206 (along the outward particle flow 232) is between 5 and 15 mm; and in an embodiment, the length is 10 mm.

In embodiments, the diameter of the smaller opening 220 of the cone-shaped second aperture 210 is between 0.1 and 0.9 mm; and in an embodiment, the diameter is 0.5 mm. In embodiments, the diameter of the larger opening 228 of the cone-shaped second aperture 210 is between 19 and 21 mm; and in an embodiment, the diameter is 20 mm. In embodiments, the length of the second aperture 210 (along the outward particle flow 232) is between 5 and 15 mm; and in an embodiment, the length is 10 mm.

Pumping block 208 includes a first chamber 222 directly along the molecular beam path 230 and a second chamber 224 fluidically coupled to the first chamber 222 through an exhaust port 226. The first chamber 222, along the molecular beam path 230, couples the larger opening of the cone-shaped internal structure of the first aperture 206 to the smaller opening 220 of the cone-shaped internal structure of the second aperture 210.

The second chamber 224 includes a second opening (the first opening coupled to the exhaust port 226) that is couplable to a vacuum pump, such as a turbomolecular pump. During operation, the vacuum pump creates a vacuum within the sampling chamber 203, which can provide an outward particle flow 232. The outward particle flow 232 maintains the pressure within the sampling chamber 203 at a lower pressure than the processing chamber 106 (which may also be under vacuum). Further, maintaining an efficient differential pumping system through the pumping block 208 prevents contamination from backstreaming gases.

Pumping block 208 includes the ion repeller 216 and a shutter mechanism 218, which may (or may not) be arranged as shown. For example, the ion repeller 216 may be arranged after the shutter mechanism 218 in the molecular beam path 230 in embodiments.

Ion repeller 216—also known as an ion reflector—affects the trajectory of charged particles, specifically ions, within the pumping block 208. In embodiments, ion repeller 216 is an electrode that generates an electric field within the pumping block 208. When an electric potential is applied to this electrode, it creates a repelling field for ions of a specific charge. This field can prevent unwanted ions that could interfere with the analysis from entering sensitive regions of the detector 124. For instance, ions that stem from unwanted sources, contaminants, or secondary ions, can be reflected or redirected away from the detector 124 to reduce noise and improve the signal-to-noise ratio of the desired analyte ions.

In addition to filtering out undesirable species, ion repeller 216 can help shape the ion beam and improve its focus, enhancing the instrument's resolving power and overall performance. By carefully controlling the electric field's strength and configuration, it's possible to refine the trajectories of ions. Hence, they are more likely to reach detector 124 at the optimal time and location for precise mass-to-charge analysis.

Shutter mechanism 218 is configured to alternate between open and closed positions, synchronized with the respective energy steps carried out by an ionizer. In an embodiment, the opening and closing actions of the shutter mechanism 218 are actuated by an electric motor, which is mechanically coupled to facilitate controlling its movement, such as by imparting rotational motion to the shutter mechanism. In embodiments, the shutter mechanism has a 10-degree rotational difference between the open and closed positions. The fast-acting pneumatic shutter mechanism 218 protects vacuum integrity and enhances system efficiency.

The shutter mechanism 218 is configured to block the particle beam along the molecular beam path 230 in the closed position, preventing the particle beam from reaching the detector 124. Accordingly, in the closed position, the particle beams physically impact the shutter mechanism 218 and are pumped out of the sampling chamber 203 through the exhaust port 226 and the second chamber 224 of pumping block 208. By operating the shutter mechanism 218 in the closed position, detector 124 can measure background data.

In contrast, in the open position, the shutter mechanism 218 is configured to allow the particle beam to traverse along the molecular beam path 230 and reach detector 124. Accordingly, in the open position, detector 124 can measure signal data (e.g., signal from the particle beam and background).

In embodiments, the detector stage 212 is coupled to the larger opening 228 of the cone-shaped second aperture 210. Detector stage 212 provides a path for the particle beam to reach detector 124 at an output port of detector stage 212 (see FIGS. 6a-b). The detector stage 212 may include multiple ports coupled to a source or a vacuum pump. When coupled to the vacuum pump, the pressure within the detector stage 212 is controlled, which allows the flow of the ions—generated using the source coupled to another port—to the detector 124.

Generally, the path length of the molecular beam path 230, from the sampling point (i.e., sampling orifice 126) in processing chamber 106 to detector 124, influences the signal-to-noise ratio. Further, the efficiency of sample transmission is also time-sensitive, particularly for unstable or short-lived species that may decay before being analyzed if travel distances are excessive. A longer path tends to present more opportunities for sample species to interact with background gases, which could result in scattering or fragmentation, thereby degrading the signal. Additionally, diffusion can lead to the dispersion of species across broader areas, reducing their concentration by the time they reach detector 124. The potential for collisions with the walls of the transfer line increases with path length as well; such collisions can cause reactive species to recombine or adhere to walls, thus diminishing the signal.

To optimize signal-to-noise ratios, it is preferable to have sampling pathways that are as short as practicable, employ high-performance vacuum systems with effective differential pumping, use materials that minimize reactivity, and reduce species dispersion.

The proposed sampling system 200, with a higher throughput and shorter path length for the gas species from the plasma to the detector than the conventional sampling system, drastically improves the signal-to-noise ratio. This enhancement improves the accuracy of results and leads to precise control parameters within plasma processes. Diagnosis and quality control become more reliable when operating with a robust signal less obscured by noise, thereby resulting in less downtime for troubleshooting and increased productivity.

The various mechanical structures in the sampling system 200 may include a series of mounting holes or built-in components to facilitate mechanical coupling within and with other mechanical assemblies. The mounting holes can be strategically positioned and dimensioned to align with corresponding fasteners and support on the other structures, enabling a secure and precise integration. Supplemental components such as brackets or screws may be incorporated to enhance the versatility and strength of the connections.

In embodiments, the sampling system 200 may include additional components such as multiple pumping blocks 208 arranged in a cascaded configuration. Each of the multiple pumping blocks may allow for a more controlled pressure evacuation within the sampling system 200. The cascaded configuration may include other vacuum chambers between the multi-pumping block configuration. In embodiments, one or more of the multi-pumping blocks in the configuration may exclude the ion repeller 216, the shutter mechanism 218, or both.

Reducing the length of the molecular beam path 230 is generally desirable to improve the measurement accuracy at the detector 124. In embodiments, the length of the molecular beam path 230 from the sampling orifice 126 to the detector 124 is between 138 and 142 mm; and in an embodiment, the length is 140 mm.

The detector stage 600 and the sampling system 200 advantageously include directly mounted turbomolecular pumps, enabling higher pumping rates to maintain higher vacuum chamber pressures without compromising performance. This removes constraints imposed by lower chamber pressures in conventional systems, providing greater flexibility for processes and detectors 124 necessitating such conditions. Further, a series of strategically placed orifices that serve as partitions between the pumping stages will be incorporated to achieve high sampling precision. These orifices are aligned to form a line-of-sight molecular beam.

This configuration can be calibrated to maintain a controlled sampling environment where plasma constituents can be transported to the detectors with minimal interference from background gases through the proposed ion repeller 500 and shutter mechanism 400.

Another advantage of the detector stage 600 and the sampling system 200 is the space economy, as the high conductance vertical pumping blocks allow for maximum vacuum performance while conservatively occupying space. By employing vertical space, for example, in the pumping block 300, the overall system ensures it can be integrated into the workflow without requiring extensive spatial reconfigurations or expansions.

Further, the proposed system can adapt to a wide spectrum of chamber pressures and gas compositions without sacrificing the fidelity or sampling accuracy of detector 124. The system can implement differentially pumped stages to facilitate sampling from chambers operating at pressures exceeding the detector's maximum capacity. This allows the system to operate effectively across a wide range of pressure conditions without compromising the integrity or functionality of sensitive detection equipment.

The proposed system enhances the capabilities of a range of detectors, including those that traditionally could not operate in a plasma environment due to, for example, pressure conditions. By offering a platform that allows these detectors to function effectively in high-pressure plasma conditions, the overall system opens new avenues for in-situ analysis and real-time monitoring, broadening the spectrum of analytics and allowing for more refined process adjustments.

The modular platform of the proposed sampling system and detector stage introduces a transformative approach to sampling by offering high-performance capabilities that seamlessly integrate with various existing detectors. This modularity supports traditional diagnostics tools and invites the use of new, previously incompatible detector types. Consequently, this expands the versatility of processing applications and gives researchers and technicians unprecedented analytical depth.

A notable aspect of the proposed system is that it allows for a high pumping rate that permits the formation of a relatively wide molecular beam. This expanded beam profile enhances the signal-to-noise ratio for the detectors, furnishing them with a stronger signal that bolsters data accuracy and reliability—a crucial element for precise plasma diagnostics. The system can maintain a short path length from plasma to the detector, which can be crucial for preventing sample degradation or secondary reactions. This is possible through a custom-engineered pumping block 300 that uses vertical space within its design, economizing on lab real estate and maximizing sample integrity.

The modular construction of the proposed system caters to varying experimental requirements; users can swap out orifices for different pressure or molecular weight specifications, reconfigure detector stages based on detection strategies, and even augment the number of pumping stages to match task-specific needs.

Figure 3A:
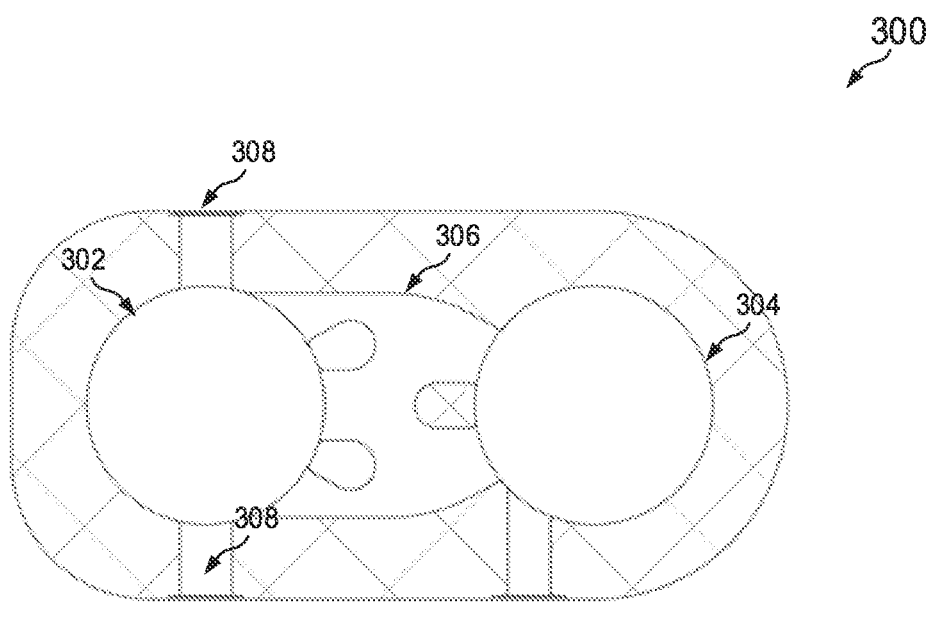
FIGS. 3*a-b* are various views of an embodiment pumping block.
Figure 3B:
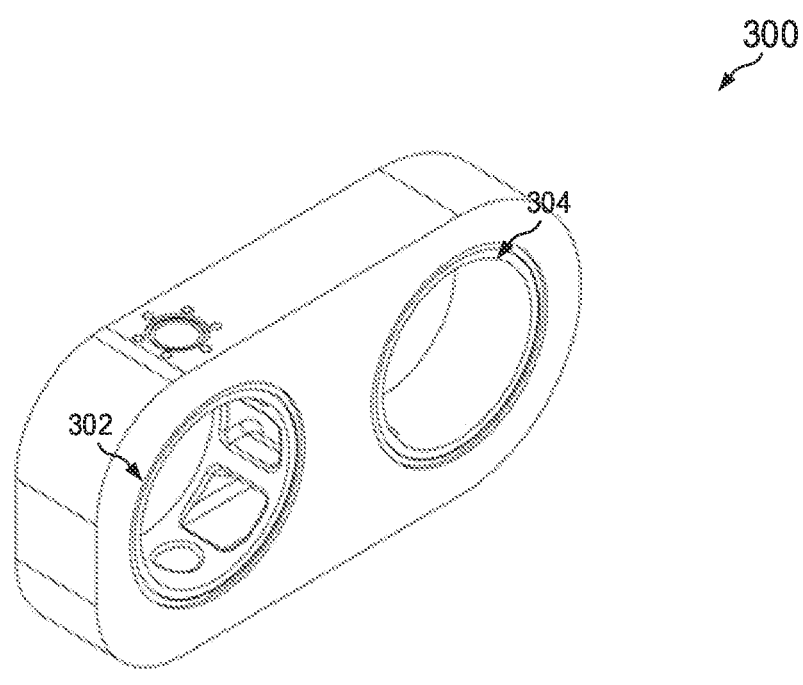

FIGS. 3a-b illustrate various views of an embodiment pumping block 300, which may be implemented as the pumping block 208 in the sampling system 200. FIG. 3a is a cross-sectional view of the pumping block 300. FIG. 3b is an isometric view of the pumping block 300. In embodiments, the pumping block 300 is coupled to reference ground.

Pumping block 300 is configured to manage the vacuum environment within the sampling system 200 and direct particle beams along the molecular beam path to detector 124. Further, the pumping block 300, through a second chamber 304, enables the differential pumping necessary to maintain the appropriate pressure gradients throughout the sampling system 200.

Pumping block 300 includes two interconnected chambers: the first chamber 302 and the second chamber 304, each performing distinct yet complementary functions in controlling gas movements within the system.

The first chamber 302 is strategically positioned along the molecular beam path 230 and acts as a transitional conduit for particles within the sampling system 200. Its design facilitates the smooth transition of molecules from the larger opening found in the cone-shaped interior of the first aperture 206 to the comparatively smaller opening 220 located at the cone-shaped internal structure of the subsequent second aperture 210. This configuration ensures a seamless particle flow, minimizing disruption to the molecular beam.

Fluid communication between the first chamber 302 and the second chamber 304 is established through an exhaust port 306, providing gas transference and a juncture for pressure modulation. This setup allows for efficient management of gases within the apparatus, effectively directing them from one chamber to the other as required by the operational demands of the system. Advantageously, the proposed pumping block 300 presents a significant improvement in efficiency, as it can enhance the pumping capacity by a factor of ten.

A second opening within the second chamber 304 is designed to interface with a high-performance vacuum device, such as a turbomolecular pump. This affords the system flexibility, enabling it to establish a robust connection with the pump imperative for creating a high vacuum environment. When operational, this pump exhibits its prowess by evacuating gases from the sampling chamber 203, thereby inducing an outward particle flow 308. This outward trajectory of particles sustains a lower pressure in the sampling chamber 203 relative to that in the processing chamber 106, even though both may be under vacuum conditions to differing extents.

By maintaining this pressure gradient, implementing an efficient differential pumping mechanism via pumping block 300 takes form. A robust differential pumping setup ensures optimal operational parameters and safeguards the system against contamination. This protective measure is achieved by preventing backstreaming gases—molecules that could travel against the intended flow direction—from entering sensitive regions of the apparatus, thus preserving the purity and integrity of the sampling environment. The orchestration of chambers and vacuum components delineates a robust system engineered to uphold precise conditions and deliver gas flow management within sampling system 200.

First chamber 302 includes a series of pumping channels 308. The pumping channels 308 lie directly along the molecular beam path 230. Having traversed through the sampling orifice 126, the molecular beam enters this first chamber 302 and encounters the pumping channels 308. The pumping channels 308 establish and maintain a localized vacuum through the exhaust port 306. Further, by selectively pumping away unwanted background gases and potential contaminants through pumping channels 308, pumping block 300 ensures that only the desired species within the molecular beam path 230 proceed toward detector 124.

In embodiments, an ionizer of a mass spectrometer (implemented as detector 124) extends through the smaller opening 220 of the cone-shaped second aperture 210 and, in an embodiment, is disposed in the first chamber 302. The distance between the ionizer and the large opening of the cone-shaped first aperture plate 206 may be small. For example, the distance between the ionizer and the large opening of the cone-shaped first aperture plate 206 may advantageously facilitate a narrow particle beam (e.g., reducing the spread of the beam along the molecular beam path 230).

In embodiments, the diameter of the first chamber 302 is between 69 and 71 mm; and in an embodiment, the diameter of the first chamber 302 is 70 mm. In embodiments, the length of the first chamber 302 (directly along the molecular beam path 130) is between 37.5 and 38.5 mm; and in an embodiment, the length of the first chamber 302 is 38 mm. In embodiments, an ion repeller (not shown) and a shutter mechanism (not shown) are placed along the molecular beam path 230 within the first chamber 302. Accordingly, the ion repeller and the shutter mechanism are dimensioned to fit within the length and the diameter of the first chamber 302.

In embodiments, the diameter of the second chamber 304 is between 69 and 71 mm; and in an embodiment, the diameter of the second chamber 304 is 70 mm. In embodiments, the length of the second chamber 304 (along the outward particle flow 232) is between 37.5 and 38.5 mm; and in an embodiment, the length of the second chamber 304 is 38 mm.

In embodiments, the length of the exhaust port 306 is between 44 and 46 mm; and in an embodiment, the length of the second chamber 304 is 45 mm. In embodiments, the width of the exhaust port 306 is between 24 and 26 mm; and in an embodiment, the width of the exhaust port 306 is 25 mm.

Figures 4A, 4B:
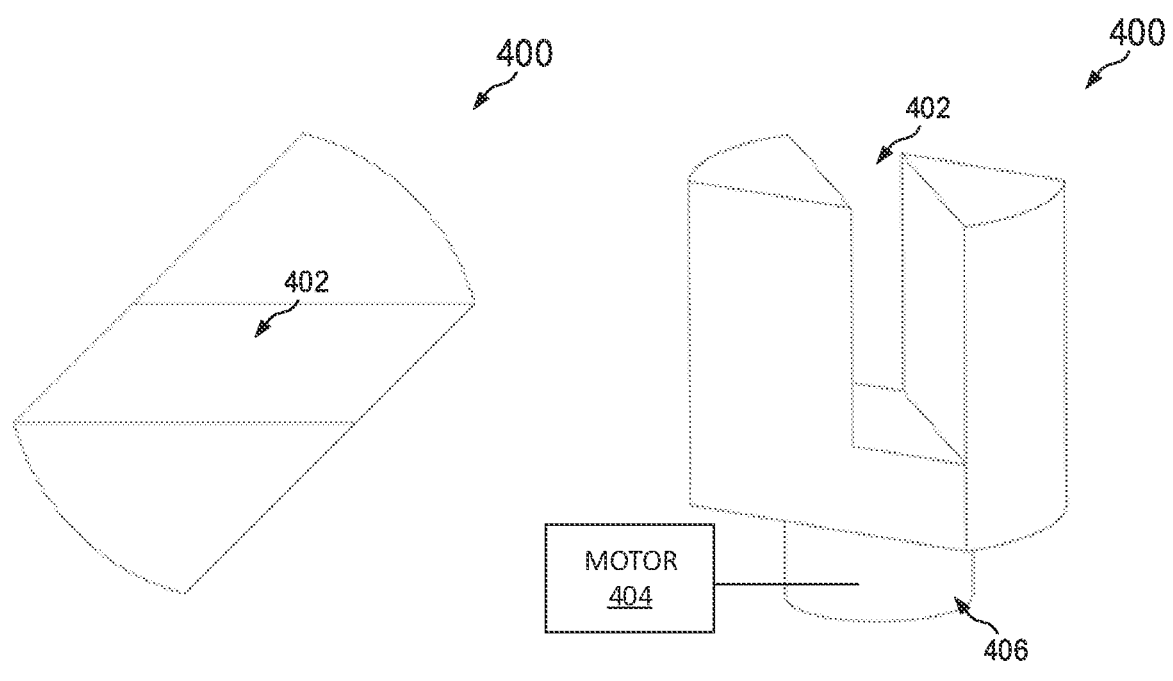
FIGS. 4*a-b* are various views of an embodiment shutter mechanism.

FIGS. 4a-b illustrate various views of an embodiment shutter mechanism 400, which may be implemented as the shutter mechanism 218 in the sampling system 200. FIG. 4a is a top view of the shutter mechanism 400. FIG. 4b is an isometric view of the shutter mechanism 400.

In embodiments, the shutter mechanism 400, capable of blocking the molecular beam, is proposed to distinguish between species originating from the processing chamber 106 and those from background contamination. When not in the open position, the shutter mechanism 400 redirects molecules toward the vacuum pump rather than allowing them to accumulate within the sampling chamber 203, preventing potential contamination and signal disruption.

A standout mechanical attribute of the proposed sampling system 200 is its fast pneumatic shutter mechanism 400. Uniquely angled to channel molecules toward the vacuum pump when not in sampling mode, it preserves vacuum integrity and prevents unnecessary gas load, enhancing sustainability and efficiency. Advantageously, angled geometry reflects a thoughtful consideration of molecular kinetics within the system's design.

The shutter mechanism 400 includes a shutter 402 mechanically coupled to an electric motor 404 through a mechanical arm 406. In an embodiment, the operations of opening and closing the shutter 402 are driven by the electrical motor 404. This electrical motor 404 is mechanically linked to the shutter via the mechanical arm 406, which manages the motions of the shutter 402 by providing it with a rotational force. The mechanical arm 406 translates the output of the electrical motor 404 into a twist or turn applied to shutter 402.

In embodiments, the shutter 402 is constructed to rotate 10 degrees to transition between its open and closed states, implying that a quarter-turn motion effectively switches the shutter 402 between allowing and obstructing the passage of particle beams. This precise degree of rotation helps ensure consistent operation and allows for a predictable and repeatable mechanism for controlling the exposure of the beam path. In other words, the shutter 402 includes a small opening that when rotated by 10 degrees can either provide an open path or a blocked path for the beam particles.

Functionally, the molecular beam path 230 for particle beams is obstructed by the shutter mechanism 400 when it is in the closed position. When the shutter mechanism 400 is in the open position, it allows the particle beam to continue along the molecular beam path 230 toward detector 124. In an embodiment, the shutter mechanism 400 features a double-sided design. This double-sided configuration is beneficial as it allows for swift transitions and minimizes extraneous interference.

The internal structure of the pumping block 300 may be configured to reduce disruption of measurements at detector 124 caused by the operation of shutter 402.

Figures 5A, 5B:
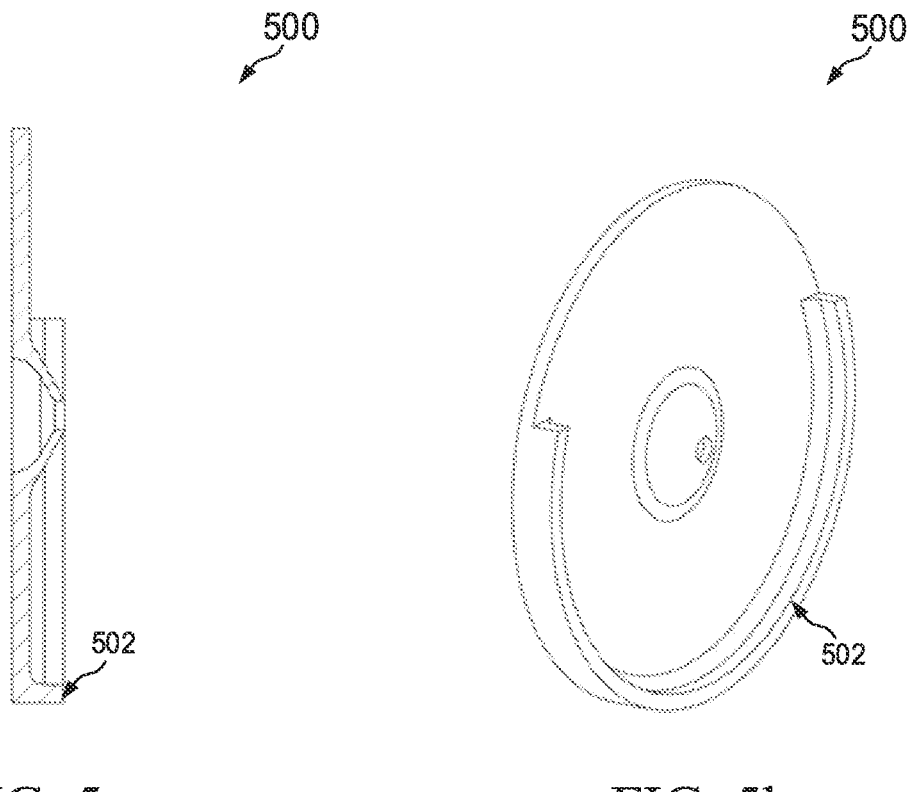
FIGS. 5*a-b* are various views of an embodiment ion repeller.

FIGS. 5*a-b* illustrate various views of an embodiment ion repeller 500, which may be implemented as the ion repeller 216 in the sampling system 200. FIG. 5*a* is a cross-sectional view of the ion repeller 500. FIG. 5*b* is an isometric view of the ion repeller 500. In embodiments, the ion repeller 500 is biased and electrically isolated from the pumping block 300.

Regarding species analysis, the ion repeller 500, integrated within the sampling system 200, is configured to separate ions from neutrals, an essential function for processes requiring a nuanced understanding of plasma species dynamics. This separation is helpful for tailored processing where specific ionic characteristics must be maintained or controlled, advantageously granting enhanced precision in ion-centric applications.

Enhancing the adaptability of the sampling system 200 is the integrated charged ion repeller 500, which is positioned to facilitate the selective removal of ions from the sampled materials. This feature is particularly beneficial for refining the analysis of neutral species without ion interference. Additionally, ion repeller 500 shortens the path length for sampled species, reducing potential interactions or fragmentation before detection.

By incorporating features like the charged ion repeller 500, the sampling system 200 can advantageously discriminate between ions and neutrals. This can be critical for many plasma-based applications that require intricate control over plasma composition and dynamics. Precisely removing and analyzing specific species opens new possibilities for material synthesis, modification, and diagnostic assessment within plasma environments. This controlled separation mechanism is distinct from bulk diagnostic methods, marking it an advantageous step forward in sampling processing technology.

Ion repeller 500 controls the movement of ions within sampling chamber 203. In embodiments, ion repeller 500 is implemented as a flat plate repeller. In embodiments, the ion repeller 500 is a flat, electrically conductive plate opposite to an ion collector, which may be another plate or electrode with a different geometry suited for collecting charged particles.

In embodiments, ion repeller 500 carries a potential opposite in polarity to the ions meant to be repelled. When plasma containing a mix of positively and negatively charged ions enters the sampling chamber 203 along the molecular beam path 230, they are separated to measure these charges selectively. In an embodiment, ion repeller 500 will be held at a positive potential to sample positive ions, thus pushing away positive ions and preventing them from reaching the collection electrode. In an embodiment, to sample negative ions, the ion repeller 500 is maintained at a negative potential to repel negatively charged particles.

Establishing an electric field between the ion repeller 500 and detector 124 ensures only ions with sufficient kinetic energy to overcome the repulsive force can reach detector 124. This allows for discriminating against low-energy ions and helps achieve a more specific ion sampling. It also helps reduce the noise level in the measurement since unwanted ions and other charged particles are effectively removed from the molecular beam path 230 to the detector 124.

The material for the ion repeller 500 is typically chosen for its conductivity and lack of reactivity with the sampled ions or other elements within the plasma. Metals such as stainless steel, gold-plated stainless steel, gold-plated brass, or other specialized conductive materials could be used depending on cost, reactivity, or specific application requirements.

In embodiments, the ion repeller 500 is isolated from the internal structure of the pumping block 300 using non-conductive standoffs. The non-conductive standoffs can be positioned between the internal wall of the first chamber 302 and the ion repeller 500. The non-conductive standoffs can be positioned along the surface of the ion repeller 500.

In embodiments, the ion repeller 500 is electrically biased (e.g., positively or negatively biased) using an electrical bias source through a conductive path along an opening of the pumping block 300 that is externally accessible to the electrical bias source.

The arrangement of the shutter mechanism 400 and the ion repeller 500 within the first chamber 302 of the pumping block 300, results in the molecular beam path 230 to be shortened compared to the existing state of the art. Advantageously, by shortening the molecular beam path 230, the signal-to-noise ratio of the overall system is significantly enhanced at the detector 124.

In embodiments, the ion repeller 500 includes an outer ring 502 configured to block gas from traveling down and back into the molecular beam path. Instead, the gas is defected towards the second chamber of the pumping block 300.

Figure 6A:
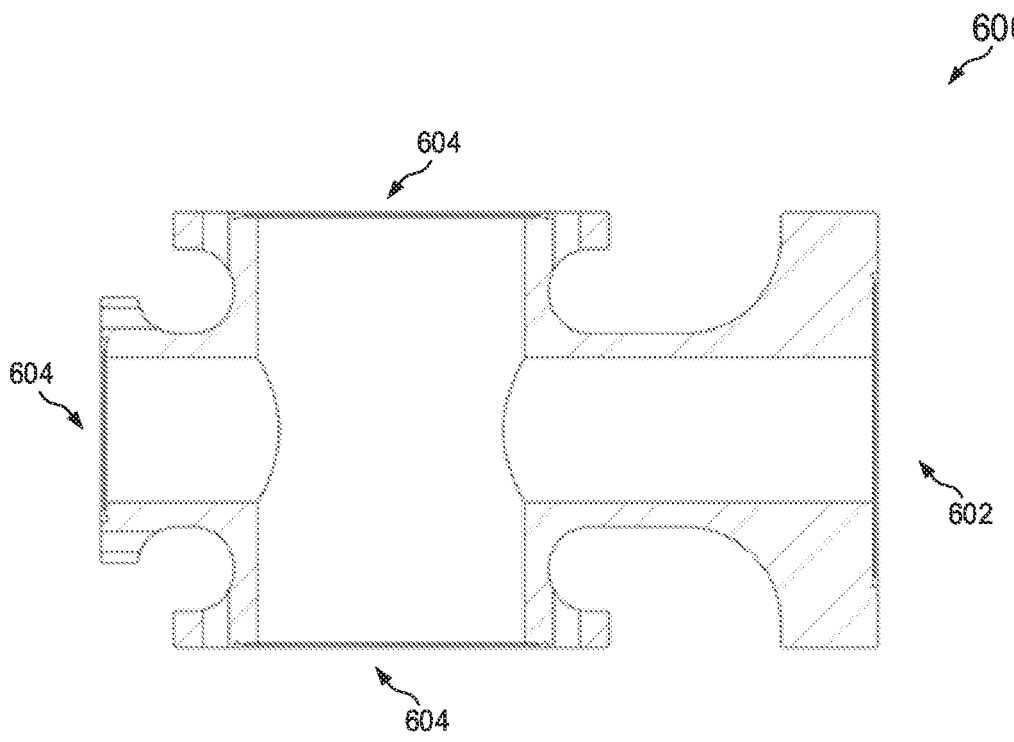
FIGS. 6*a-b* are various views of an embodiment detector stage.
Figure 6B:
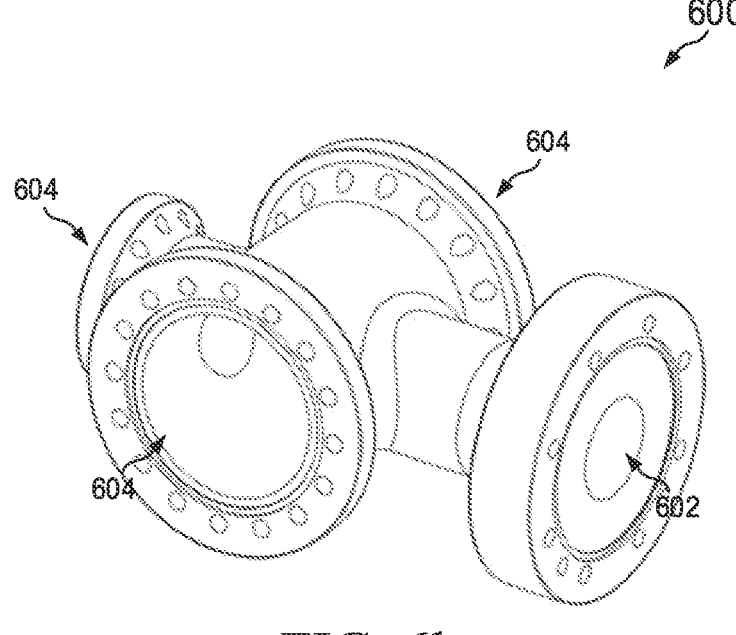

FIGS. 6*a-b* illustrate various views of an embodiment detector stage 600, which may be implemented as the detector stage 212 in the sampling system 200. FIG. 6*a* is a cross-sectional view of the detector stage 600. FIG. 6*b* is an isometric view of the detector stage 600.

The particle beam progresses through the second aperture 210 and arrives at the detector stage 600. The detector stage 600 includes an entrance port 602 fluidically coupled to the exit port (larger diameter opening of the cone-shaped structure) of the second aperture 210. It's important to note that additional mechanical structures may be installed between the second aperture 210 and the detector stage 600 in certain embodiments.

As shown, the detector stage 600 includes three (non-limiting) exit ports 604, 606, and 608. These exit ports can serve various functions depending on the attached component thereto. For example, each port could be attached to a turbomolecular vacuum pump, an external source, or the detector 124. In embodiments, the exit port 604 that aligns with the molecular beam path 230 (on the opposing side of the entrance port 602) is linked directly to detector 124. In embodiments, the remaining exit ports can couple to either a vacuum pump or a source.

When coupled to a vacuum pump, an exit port allows for proper pressure adjustment within the detector stage 600. This ensures the particle beams are accurately channeled towards detector 124 due to the created differential pressure.

When coupled to a source, the exit port allows for the generation of a stream or beam of ions from the particle beam sample to be analyzed at the entrance port 602. Generally, ionization enables the subsequent separation and identification of the sample's constituent molecules based on their mass-to-charge ratios. For example, the ionized state of the sample to be analyzed allows for manipulating and controlling the particles using electric and magnetic fields. The source's design and operational principles are tailored to suit the specific plasma processing and analysis requirements.

A common variety of sources used in this context is the Inductively Coupled Plasma (ICP) source. The ICP source generates a high-temperature ionized gas or plasma, proficient at ionizing nearly all elements within a sample to their charged state. This capability makes it useful in plasma processing systems, particularly for applications requiring thorough and sensitive analysis of materials. When a sample is introduced into the ICP source using, for example, a nebulizer that converts the sample into an aerosol, it is then transported into an argon plasma. Inside the plasma torch, the sample aerosol encounters extremely high temperatures, on the order of several thousand degrees Celsius, which results from inductively coupling radio frequency (RF) power into flowing argon gas. At these temperatures, the atoms in the sample are excited to such an extent that they lose electrons and become ionized. This ionization within the ICP source produces a consistent stream of charged particles—ions—that can now be extracted, focused, and directed to a mass spectrometer's analyzer. Once in the analyzer, these ions are sorted based on their mass-to-charge ratio for detection and quantification.

Figure 7:
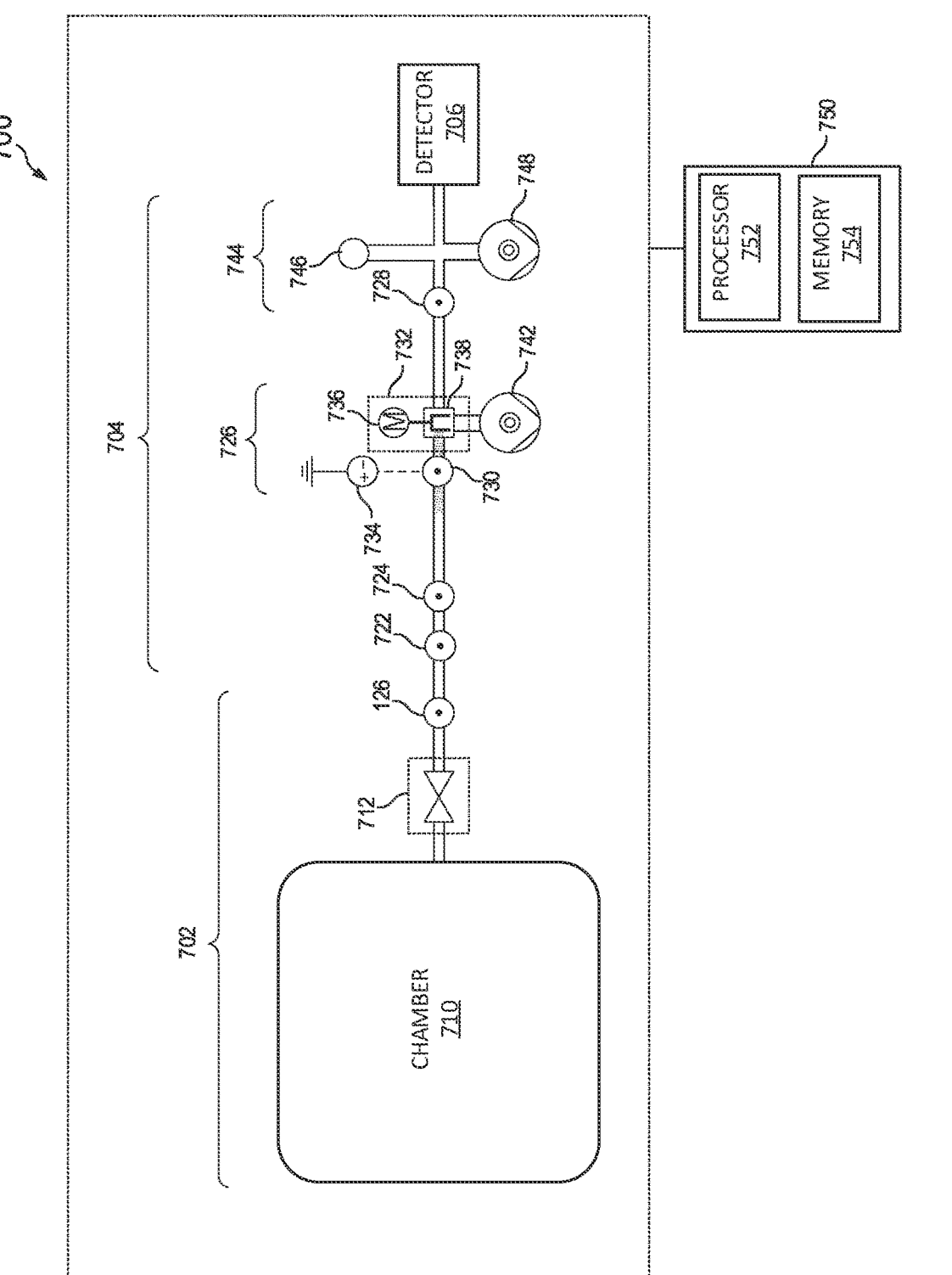
FIG. 7 is a schematic layout of an embodiment system.

FIG. 7 illustrates a schematic layout of an embodiment system 700. System 700 includes a processing system 702, a sampling system 704, and a detector 706, which may (or may not) be arranged as shown. System 700 may include additional components not shown. In embodiments, the processing system 702 may be implemented as the processing system 100. In embodiments, the sampling system 704 may be implemented as the sampling system 200. In embodiments, detector 706 may be implemented as the detector 124.

The processing system 702 includes a chamber 710 and a valve 712. Chamber 710 may be implemented in the processing system 100 as the processing chamber 106. In embodiments, the valve 712 is an electrically operated gate valve. Valve 712 allows particles from the processing chamber 106 to reach the sampling orifice 126.

The particle beam is focused by a focusing chamber 722, a first aperture 724, and a second aperture 728. In embodiments, the focusing chamber 722 is implemented as the focusing chamber 204. In embodiments, the first aperture 724 is implemented as the first aperture 206. In embodiments, the second aperture 728 is implemented as the second aperture 210.

The pumping block 726 includes an ion repeller 730 and a shutter mechanism 732. In embodiments, the ion repeller 730 is electrically biased (e.g., positively or negatively biased) using an electrical bias source 734. In some embodiments, ion repeller 730 may be implemented as the ion repeller 500. The shutter mechanism 732 may be implemented as the shutter mechanism 400. The shutter mechanism 732 includes a motor 736 coupled to the shutter 738 to allow the 10-degree rotation of the shutter 738 to provide an open or closed position for the molecular beam path 740. The pumping block 726 is coupled to a vacuum pump 742. In embodiments, the vacuum pump 742 is a turbomolecular pump. In embodiments, the pumping speed of the vacuum pump 742 is approximately 84 liters per second (l/s). The pumping speed may depend on various factors, such as the volume of the chamber 710 and the size of the orifices.

The detector stage 744 is arranged between the second aperture 728 and the detector 706. The detector stage 744 is coupled to a source 746 and a vacuum pump 748. In embodiments, the vacuum pump 748 is a turbomolecular pump. In embodiments, the pumping speed of the vacuum pump 748 is approximately 84 (l/s). The pumping speed may depend on various factors, such as the volume of the chamber 710 and the size of the orifices.

In embodiments, the operation of the various components in the system 700 is controlled by a controller 750. Controller 750 may include a processor 752 and a memory 754. Processor 752 may be any component or collection of components adapted to perform computations or other processing-related tasks. Memory 754 may be any component or collection of components adapted to store programming or instructions for execution by processor 752. In an embodiment, memory 754 includes a non-transitory computer-readable medium.

Figure 8:
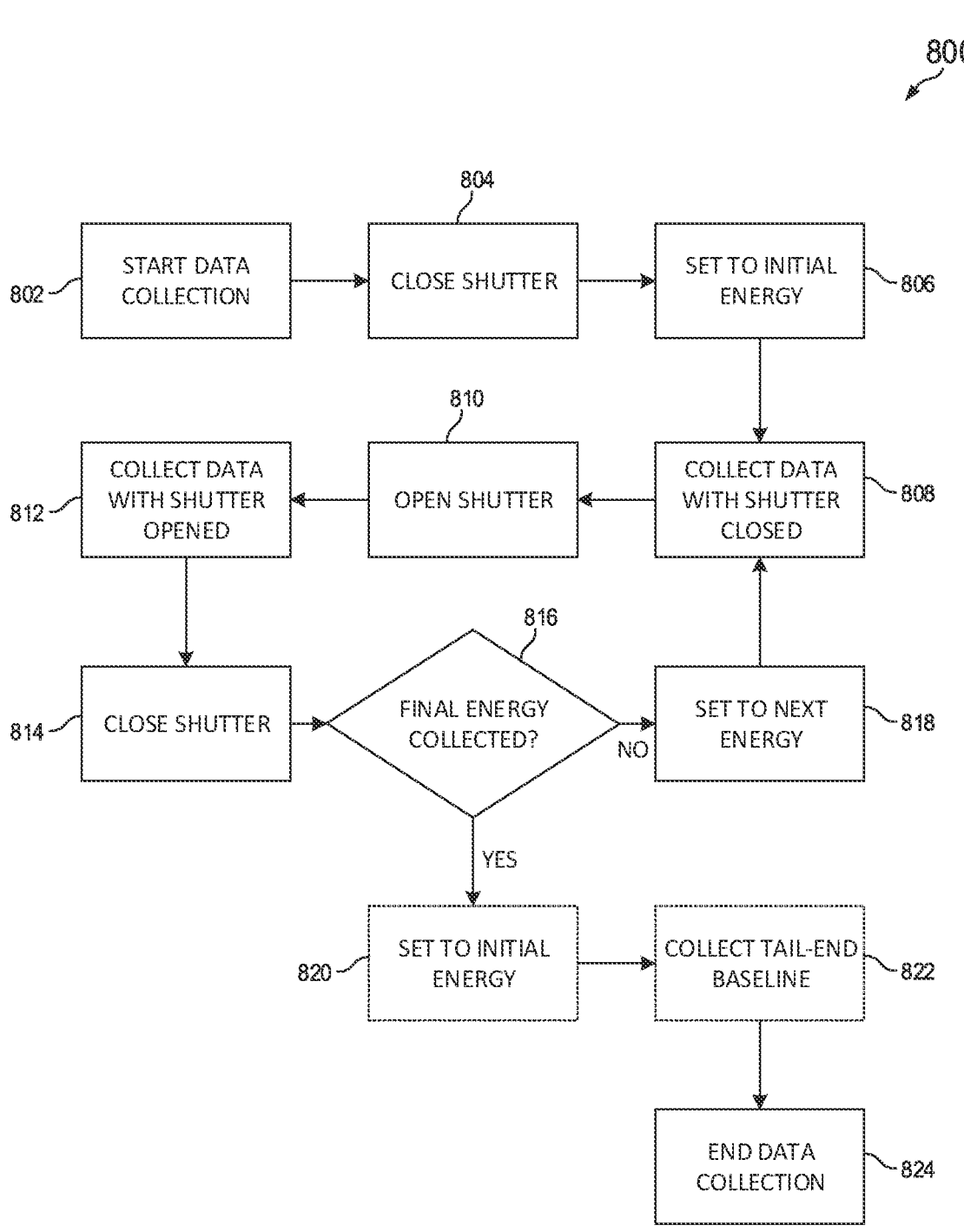
FIG. 8 is a flow chart of an embodiment method for operating the system of FIG. 7.

FIG. 8 illustrates a flow chart of an embodiment method 800 for operating the system 700. Method 800 collects quantification data to a detector from a processing chamber. It is noted that all steps outlined in the flow chart of method 800 are not necessarily required and can be optional. Further, changes to the arrangement of the steps, removal of one or more steps and path connections, and addition of steps and path connections are similarly contemplated.

At step 802, method 800 begins with a processing system's initial step of starting data collection. The processing system may include a controller coupled to a pumping block of a sampling system. The controller may be coupled to the detector. The controller is configured to initiate the data collection in the processing system. The controller may include a processor and a non-transitory computer-readable medium storing a program including instructions that, when executed, perform the method 800. The controller may be implemented as an executable program stored in non-transitory computer-readable media of a general-purpose computer. In other embodiments, the controller may be a dedicated controller capable of accepting parameter inputs from a user interface or external source such as a connected computer.

In embodiments, the operation of the ion repeller within the pumping block and the operation of the vacuum pumps coupled to the pumping block is initiated during step 802. Further, other vacuum pumps coupled to, for example, a detector stage along the molecular beam path and coupled to the detector may also be initiated during step 802.

At step 804, a shutter of a shutter mechanism implemented in the pumping block is positioned in the closed position. In the closed position, the shutter blocks the particle beams from reaching the detector, such as a mass spectrometer. The electron energy of an ionizer of the mass spectrometer is set to an initial energy value in step 806. Optionally, an initial baseline is collected as a reference point for the data collection.

After the initial baseline is either collected or omitted, a series of steps are cyclically performed as an electron energy sweep. Data is collected with the shutter closed in step 808. The data collected in step 808 includes quantification data of the background because the shutter is closed. The shutter blocks the particle beam, and only particles not part of the coherent beam can reach the mass spectrometer.

At step 810, after background quantification data is collected in step 808, the shutter is opened, and data is collected at step 812. The data collected in step 812 includes quantification data of the particle beam (e.g. signal data) and data generated by the background. After collecting the signal quantification data, the shutter is again closed at step 814.

At step 816, the controller checks whether the electron energy equals a predetermined final value. If not, the electron energy is set to the next energy step in step 818, and the loop resumes again, collecting background data at step 808. In this way, the cyclic data collection process steps through a range of electron energies, starting at an initial energy value and executing a data collection loop for each of a plurality of energy steps.

If, at step 816, the controller determines that the electron energy equals the final energy, the loop is exited, and the energy is optionally set back to the initial energy value at step 820 so that a tail-end baseline may be optionally collected at step 822. Data collection is then ended in step 824. In cases where the tail-end baseline is not collected, method 800 may proceed directly from step 820 to step 824 upon determining that data has been collected for the final energy value. Collecting a tail-end baseline (i.e., after data collection) may be beneficial when measuring high-density gas/plasma from the processing chamber to correct for baseline shift due to charging in the mass spectrometer during continuous use and to verify processing chamber stability throughout the data collection process.

The duration of the data collection steps may be advantageously short.

The method 800, including the electron energy sweep, may advantageously be performed automatically. The background and baseline data may be automatically used to limit misdiagnosis of the system due to contamination or drift. Qualitative and quantitative analysis of the data may also be performed automatically. This way, process engineers' necessary knowledge and effort to obtain diagnostic information is reduced advantageously. Automated diagnostics may carry the additional benefit of reducing human error as well. Further, multiple electron energy scans may be batch-processed, resulting in a comprehensive diagnostic report for a given process.

A first aspect relates to a plasma processing system. The plasma processing system includes a processing chamber configured to contain a plasma; a pumping block fluidically coupled to the processing chamber via a first orifice, the pumping block having a first chamber and a second chamber vertically stacked, the first orifice configured to generate a particle beam from the plasma using a pressure differential between the first chamber and the processing chamber, a pressure of the first chamber controlled by a first vacuum pump coupled to the second chamber; a detector stage fluidically coupled to the pumping block via a second orifice, the detector stage couplable to a second vacuum pump configured to direct the particle beam to a third orifice; a mass spectrometer fluidically coupled to the detector stage via the third orifice, the mass spectrometer comprising an ionizer configured to ionize species of the particle beam by sweeping through a range of electron energies in a plurality of energy steps; and a shutter disposed in the pumping block between the first orifice and the mass spectrometer in a path of the particle beam, the shutter configured to open and close during each of the plurality of energy steps.

In a first implementation form of the plasma processing system according to the first aspect as such, the plasma processing system further includes a series of skimmers and collimation mechanisms that direct the particle beam from the processing chamber to the mass spectrometer.

In a second implementation form of the plasma processing system according to the first aspect as such or any preceding implementation form of the first aspect, the shutter is configured to rotate within a 10-degree rotational direction to transition between the open and close configurations.

In a third implementation form of the plasma processing system according to the first aspect as such or any preceding implementation form of the first aspect, the path of the particle beam is a straight line from the processing chamber to the mass spectrometer, and wherein a distance for the particle beam to travel from the processing chamber to the mass spectrometer is less than 140 millimeters.

In a fourth implementation form of the plasma processing system according to the first aspect as such or any preceding implementation form of the first aspect, the pumping block further comprises an ion repeller within the first chamber, and wherein the ion repeller is configured to repel a trajectory of charged particles from the mass spectrometer.

In a fifth implementation form of the plasma processing system according to the first aspect as such or any preceding implementation form of the first aspect, the ion repeller is configured to repel the charged particles to the first vacuum pump coupled to the second chamber.

In a sixth implementation form of the plasma processing system according to the first aspect as such or any preceding implementation form of the first aspect, the mass spectrometer is a residual gas analyzer (RGA) type of mass spectrometer.

A second aspect relates to a sampling system for a plasma processing system. The sampling system includes a pumping block fluidically couplable to a processing chamber of the plasma processing system, the pumping block having a first chamber and a second chamber vertically stacked, the first chamber providing a path for a particle beam from a plasma within the processing chamber to in response to a pressure differential between the first chamber and the processing chamber, a pressure of the first chamber controlled by a first vacuum pump coupled to the second chamber; a shutter arranged in the pumping block in the path of the particle beam, the shutter configured to open and close during an energy sweep in a series of energy steps by an ionizer of a mass spectrometer, the ionizer configured to ionize species of the particle beam; and a detector stage fluidically coupled to the pumping block along the path of the particle beam, the detector stage couplable to a second vacuum pump configured to direct the particle beam to the mass spectrometer.

In a first implementation form of the sampling system according to the second aspect as such, the sampling system further includes a series of skimmers and collimation mechanisms that direct the particle beam from the processing chamber to the mass spectrometer.

In a second implementation form of the sampling system according to the second aspect as such or any preceding implementation form of the second aspect, the shutter is configured to rotate within a 10-degree rotational direction to transition between the open and close configurations.

In a third implementation form of the sampling system according to the second aspect as such or any preceding implementation form of the second aspect, the path of the particle beam is a straight line from the processing chamber to the mass spectrometer, and wherein a distance for the particle beam to travel from the processing chamber to the mass spectrometer is less than 140 millimeters.

In a fourth implementation form of the sampling system according to the second aspect as such or any preceding implementation form of the second aspect, the pumping block further includes an ion repeller within the first chamber, and wherein the ion repeller is configured to repel a trajectory of charged particles from the mass spectrometer.

In a fifth implementation form of the sampling system according to the second aspect as such or any preceding implementation form of the second aspect, the ion repeller is configured to repel the charged particles to the first vacuum pump coupled to the second chamber.

In a sixth implementation form of the sampling system according to the second aspect as such or any preceding implementation form of the second aspect, the mass spectrometer is a residual gas analyzer (RGA) type of mass spectrometer.

A third aspect relates to a method of measuring quantities of species in a processing chamber. The method includes closing a shutter positioned between the processing chamber and a mass spectrometer to block a particle beam originating from the processing chamber, the mass spectrometer comprising an ionizer, the shutter arranged in a first chamber of a pumping block, the pumping block having a second chamber coupled to a vacuum pump, the second chamber providing a pressure differential between the first chamber and the processing chamber to provide a path for the particle beam from the processing chamber to the first chamber; setting an electron energy of the ionizer to an initial energy value; sweeping the electron energy from the initial energy value to a final energy value by cyclically: collecting background quantification data while the shutter is closed, opening the shutter, collecting signal quantification data of species in the particle beam while the shutter is open, closing the shutter, and setting the electron energy to a next value; and after collecting signal quantification data with the electron energy set at the final energy value, determining quantities of species in the processing chamber using the signal quantification data and the background quantification data.

In a first implementation form of the method according to the third aspect as such, the method further includes directing, by a series of skimmers and collimation mechanisms, the particle beam from the processing chamber to the mass spectrometer in response to the shutter being in the open position.

In a second implementation form of the method according to the third aspect as such or any preceding implementation form of the third aspect, the opening and the closing of the shutter comprises rotating the shutter by 10 degrees.

In a third implementation form of the method according to the third aspect as such or any preceding implementation form of the third aspect, the path of the particle beam is a straight line from the processing chamber to the mass spectrometer, and wherein a distance for the particle beam to travel from the processing chamber to the mass spectrometer is less than 140 millimeters.

In a fourth implementation form of the method according to the third aspect as such or any preceding implementation form of the third aspect, the pumping block further comprises an ion repeller within the first chamber, the method further comprising repelling, by the ion repeller, a trajectory of charged particles from the mass spectrometer.

In a fifth implementation form of the method according to the third aspect as such or any preceding implementation form of the third aspect, the mass spectrometer is a residual gas analyzer (RGA) type of mass spectrometer.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include processes, machines, manufacture, compositions of matter, means, methods, or steps within their scope.

Accordingly, the specification and drawings are to be regarded simply as an illustration of the disclosure as defined by the appended claims and are contemplated to cover any and all modifications, variations, combinations, or equivalents that fall within the scope of the present disclosure.

What is claimed is:

1. A plasma processing system, comprising:
   a processing chamber configured to contain a plasma;
   a pumping block fluidically coupled to the processing chamber via a first orifice, the pumping block having a first chamber and a second chamber vertically stacked, the first orifice configured to generate a particle beam from the plasma using a pressure differential between the first chamber and the processing chamber, a pressure of the first chamber controlled by a first vacuum pump coupled to the second chamber;
   a detector stage fluidically coupled to the pumping block via a second orifice, the detector stage couplable to a second vacuum pump configured to direct the particle beam to a third orifice;
   a mass spectrometer fluidically coupled to the detector stage via the third orifice, the mass spectrometer comprising an ionizer configured to ionize species of the particle beam by sweeping through a range of electron energies in a plurality of energy steps; and
   a shutter disposed in the pumping block between the first orifice and the mass spectrometer in a path of the particle beam, the shutter configured to open and close during each of the plurality of energy steps.

2. The plasma processing system of claim 1, further comprising a series of skimmers and collimation mechanisms that direct the particle beam from the processing chamber to the mass spectrometer.

3. The plasma processing system of claim 1, wherein the shutter is configured to rotate within a 10-degree rotational direction to transition between the open and close configurations.

4. The plasma processing system of claim 1, wherein the path of the particle beam is a straight line from the processing chamber to the mass spectrometer, and wherein a distance for the particle beam to travel from the processing chamber to the mass spectrometer is less than 140 millimeters.

5. The plasma processing system of claim 1, wherein the pumping block further comprises an ion repeller within the first chamber, and wherein the ion repeller is configured to repel a trajectory of charged particles from the mass spectrometer.

6. The plasma processing system of claim 5, wherein the ion repeller is configured to repel the charged particles to the first vacuum pump coupled to the second chamber.

7. The plasma processing system of claim 1, wherein the mass spectrometer is a residual gas analyzer (RGA) type of mass spectrometer.

8. A sampling system for a plasma processing system, the sampling system comprising:
    a pumping block fluidically couplable to a processing chamber of the plasma processing system via a first orifice, the pumping block having a first chamber and a second chamber vertically stacked, the first chamber providing a path for a particle beam generated by the first orifice from a plasma within the processing chamber in response to a pressure differential between the first chamber and the processing chamber, a pressure of the first chamber controlled by a first vacuum pump coupled to the second chamber;
    a shutter arranged in the pumping block in the path of the particle beam, the shutter configured to open and close during an energy sweep in a series of energy steps by an ionizer of a mass spectrometer, the ionizer configured to ionize species of the particle beam; and
    a detector stage fluidically coupled to the pumping block along the path of the particle beam via a second orifice, the detector stage couplable to a second vacuum pump configured to direct the particle beam to the mass spectrometer via a third orifice fluidically coupling the mass spectrometer to the detector stage.

9. The sampling system of claim 8, further comprising a series of skimmers and collimation mechanisms that direct the particle beam from the processing chamber to the mass spectrometer.

10. The sampling system of claim 8, wherein the shutter is configured to rotate within a 10-degree rotational direction to transition between the open and close configurations.

11. The sampling system of claim 8, wherein the path of the particle beam is a straight line from the processing chamber to the mass spectrometer, and wherein a distance for the particle beam to travel from the processing chamber to the mass spectrometer is less than 140 millimeters.

12. The sampling system of claim 8, wherein the pumping block further comprises an ion repeller within the first chamber, and wherein the ion repeller is configured to repel a trajectory of charged particles from the mass spectrometer.

13. The sampling system of claim 12, wherein the ion repeller is configured to repel the charged particles to the first vacuum pump coupled to the second chamber.

14. The sampling system of claim 8, wherein the mass spectrometer is a residual gas analyzer (RGA) type of mass spectrometer.

15. A sampling system for measuring quantities of species in a processing chamber, the sampling system comprising:
    a mass spectrometer comprising an ionizer; and
    a shutter positioned between the processing chamber and the mass spectrometer, the shutter configured to block a particle beam, the particle beam originating from the processing chamber and generated by a first orifice, the shutter arranged in a first chamber of a pumping block fluidically coupled to the processing chamber via the first orifice, the pumping block having a second chamber coupled to a first vacuum pump, the first chamber and the second chamber being vertically stacked, the second chamber providing a pressure differential between the first chamber and the processing chamber to provide a path for the particle beam from the processing chamber to the first chamber; and
a detector stage fluidically coupled to the pumping block via a second orifice and fluidically coupled to a second vacuum pump to direct the particle beam to a third orifice fluidically coupling the mass spectrometer to the detector stage,
wherein an electron energy of the ionizer is set to an initial energy value,
wherein the electron energy is swept from the initial energy value to a final energy value cyclically,
wherein background quantification data is collected while the shutter is closed,
wherein signal quantification data of species in the particle beam is collected while the shutter is open,
wherein the electron energy is set to a next value in response to closing the shutter a second time after opening the shutter, and
wherein quantities of species in the processing chamber are determined using the signal quantification data and the background quantification data after collecting the signal quantification data with the electron energy set at the final energy value.

16. The sampling system of claim 15, wherein the particle beam is directed by a series of skimmers and collimation mechanisms from the processing chamber to the mass spectrometer in response to the shutter being in the open position.

17. The sampling system of claim 15, wherein an opening and the closing of the shutter comprise rotating the shutter by 10 degrees.

18. The sampling system of claim 15, wherein the path of the particle beam is a straight line from the processing chamber to the mass spectrometer, and wherein a distance for the particle beam to travel from the processing chamber to the mass spectrometer is less than 140 millimeters.

19. The sampling system of claim 15, wherein the pumping block further comprises an ion repeller within the first chamber, and wherein a trajectory of charged particles is repelled by the ion repeller from the mass spectrometer.

20. The sampling system of claim 15, wherein the mass spectrometer is a residual gas analyzer (RGA) type of mass spectrometer.

* * * * *